United States Patent
Roozeboom et al.

(10) Patent No.: US 6,173,116 B1
(45) Date of Patent: Jan. 9, 2001

(54) FURNACE FOR RAPID THERMAL PROCESSING

(75) Inventors: Freddy Roozeboom; Peter A. Duine; Paul Van Der Sluis, all of Eindhoven (NL)

(73) Assignee: U.S. Philips Corporation, New York, NY (US)

( * ) Notice: Under 35 U.S.C. 154(b), the term of this patent shall be extended for 0 days.

(21) Appl. No.: 09/506,543

(22) Filed: Feb. 17, 2000

Related U.S. Application Data

(62) Division of application No. 08/994,153, filed on Dec. 19, 1997, now Pat. No. 6,047,107.

(51) Int. Cl.⁷ ............................................. A21B 2/00
(52) U.S. Cl. .................... 392/416; 219/390; 118/724; 359/273
(58) Field of Search ................................. 219/390, 405, 219/411; 392/416, 418, 422, 423; 359/265, 267, 270, 273, 274; 118/724, 725, 50.1

(56) References Cited

U.S. PATENT DOCUMENTS 4,828,369 * 5/1989 Hotomi ............................... 350/357
4,867,541 * 9/1989 Hotomi ............................... 350/357
5,905,590 * 5/1999 Van Der Sluis et al. ............ 359/275

* cited by examiner

Primary Examiner—Teresa Walberg
Assistant Examiner—Shawntina Fuqua
(74) Attorney, Agent, or Firm—Steven R. Biren

(57) ABSTRACT

A Method (1) for Rapid Thermal Processing of a wafer (7), wherein the wafer (7) is heated by lamps (9), and the heat radiation is reflected by an optical switching device (15,17) which is in the reflecting state during the heating stage. During the cooling stage of the wafer (7), the heat is absorbed by the switching device (15,17), which is in the heat-absorbing state. The switching device includes a switching film of a trivalent metal, such as gadolinium, which is capable of forming hydrides by an exchange of hydrogen. Dependent on the hydrogen concentration of the hydrides, the film reflects or absorbs heat. The hydrogen content in the switching film can be changed by varying the partial pressure of hydrogen, or, preferably, by varying the potential of the switching film forming part of a stack of layers in an electrochemical cell.

1 Claim, 1 Drawing Sheet

FURNACE FOR RAPID THERMAL PROCESSING

CROSS REFERENCE TO RELATED APPLICATIONS

This is a divisional of application Ser. No. 08/994,153 filed Dec. 19, 1997, now U.S. Pat. No. 6,047,107.

BACKGROUND OF THE INVENTION

The invention relates to a furnace for Rapid Thermal Processing of wafers, comprising a housing in which there are provided:

means for supporting the wafer, heat control means capable of reflecting heat radiation to the wafer, means for generating heat radiation situated between the wafer and the heat control means.

The invention also relates to a method for Rapid Thermal Processing of wafers, especially semiconductor wafers.

In the manufacture of integrated circuits from semiconductor wafers (such as silicon), Rapid Thermal Processing (RTP) is gaining ground. The main advantages of RTP are the reduced temperature load of the wafers, and the reduction of the process cycle time. In an RTP furnace wafers are heated by infrared lamps. The inner walls of the furnace are provided with highly heat (infrared) reflective coatings in order to obtain a maximum heat rate and an optimum temperature uniformity during the steady state cycle. In an ideal process a heating rate of 300° C./s to 1100° C., an annealing time of 5 s at 1100° C., and a cooling rate of 100° C./s are required. A disadvantage is that during the cooling stage the heat content of the wafer cannot be dissipated quickly. A more rapid cooling rate is prevented by the highly reflective walls of the furnace. A large part of the heat emitted by the wafer will be reflected back towards the wafer. Consequently, the throughput of the wafers is reduced. By making the walls absorb heat during the cooling stage and reflect heat during the heating stage, the cooling rate will be enhanced too and hence the process cycle time reduced.

In German patent application DE-A-4141466, a description is given of a process room for RTP which has been provided with an array of rotatable lamellae between the lower and upper walls and the heat sources. These lamellae are mechanically rotatable around their longitudinal axes and function as heat control means. Each lamella has been provided on one side with a reflective gold coating, whereas the other side has been provided with a black surface. During heating, the reflective sides of the lamellae are exposed to the wafer. For rapid cooling of the wafer, the rear sides of the lamellae, which are black, are turned towards the wafer in order to absorb the heat radiation emitted by the wafer during the cooling stage. In this way, rapid cooling of the wafer could be obtained. A disadvantage is that in the known furnace the reflectors are mechanically driven, which, in most cases, is rather complicated and increases the risk of particle formation. Moreover, the heat dissipation is limited, because the lamellae have a limited heat capacity. Also the control of an individual reflector, to increase the uniformity of the temperature profile, is cumbrous.

SUMMARY OF THE INVENTION

It is an object of the present invention to provide a furnace for RTP of wafers in which the alternate reflection and absorption of heat radiation is obtained in an alternative way. Moreover, in the furnace of the present invention the above mentioned disadvantages are prevented.

According to the invention, these objects are achieved by a furnace as described in the opening paragraph, which is characterized in that the heat control means comprise an optical switching device having a switching film containing a trivalent metal capable of forming hydrides, which film can be reversibly switched by an exchange of hydrogen from a first state, which is a heat-reflecting state, to a second state, which is a black heat-absorbing state or a transparent state.

The switching film as used in the present invention is based on the phenomenon that some trivalent metals, such as the transition metals Y, Sc and La, and rare earth metals, such as Gd and Sm, can be reversibly converted from a low hydrogen content (approx. dihydride) composition into a hydrogen-rich (approx. trihydride) composition by an exchange of hydrogen, which phenomenon has been described in the non-prepublished international patent application WO 96/38758, filed by Applicants. Both compositions have different optical properties. At a low hydrogen content, the switching film prepared from such a trivalent metal has a metallic character: it is non-transparent, and reflective or mirror-like, at least in the infrared region of the spectrum. At a high hydrogen content, the switching film is transparent. During heating-up and annealing of the wafer, the switching film is switched to the reflective state, whereas during cooling the switching film is switched to the transparent state. In this embodiment, the walls of the furnace have been made heat absorbing, for example, by providing the walls with a black coating, so that in the transparent state of the switching film, the heat of the wafer can be easily dissipated away into the (water-)cooled walls. In this way, the reflectivity of the heat control means is regulated in a non-mechanical way, thereby preventing the risk of particle formation.

Switching of the switching film takes place with hydrogen. The reflection of the switching film is governed by the hydrogen content: the reflection decreases as the hydrogen content increases. If molecular hydrogen gas is supplied to the switching film, the reflection decreases as the hydrogen pressure increases. The hydrogen must be dissociated to atomic H. The rate of dissociation can be increased by providing the surface of the switching film with a thin cap layer of palladium having a thickness, for example, of 5 nm. At said thickness, the palladium layer is discontinuous. The layer thickness is not critical and is chosen to be in the range between 2 and 25 nm. Thin layers of 2 to 10 nm are preferred, however, because the thickness of the palladium layer determines the maximum transmission of the switching device. In addition, the palladium cap layer protects the underlying switching film against oxidation.

Apart from palladium, other catalytically active metals which promote hydrogen dissociation, such as platinum, nickel and cobalt, or alloys with these metals, can be used as the cap layer.

The molecular hydrogen can be passed from a gas cylinder filled with $H_2$ into the furnace in a simple manner. A low-hydrogen switching film in the reflective state will change into a transparent high-hydrogen state. This conversion is reversible: the transparent film is converted to the reflective state by heating and/or evacuation of hydrogen.

The switching film in accordance with the invention is thin, i.e. its film thickness is less than 2 $\mu$m. The film thickness of the switching film preferably ranges between 100 and 1,000 nm. As hydrogen must diffuse in the switching film, the film thickness determines the rate of full conversion from the reflective to the transparent state, and conversely.

Preferably, in addition to the trivalent metal, the switching film also comprises magnesium. The addition of Mg to the trivalent metal increases the transmission of the switching film in the transparent state and the reflection in the non-transparent state. The addition of more than 60 at. % Mg to a switching film containing, e.g. Gd results in three stable states which are dependent on the hydrogen content of the switching film, i.e. as the hydrogen content increases: a reflective state, a black absorbing state, and a transparent state. Up to 95 at. % Mg may be added to the switching film. In this connection, atomic percentages are expressed as a percentage of the total metal content, i.e. excluding the hydrogen content. The presence of a trivalent metal, even in a small amount, is essential. Apart from Gd, other trivalent transition and rare earth metals, and alloys of these metals, exhibit similar phenomena. Examples of these metals are e.g. lutetium (Lu), yttrium (Y) and lanthanum (La). In this embodiment, switching of the switching film is performed between the reflective state, during the heating stage of the wafer, and the black absorbing state, during rapid cooling of the wafer. In this embodiment, there is no need to provide the furnace with black absorbing walls. Preferably, the switching device is placed directly onto the (water-)cooled walls of the furnace in order to dissipate the heat.

Instead of an alloy of a trivalent metal and magnesium, a stack of alternating thin layers of a trivalent metal and Mg may be used, e.g. a multilayer stack of 50 Mg|Gd pairs. Such a multilayer has the additional advantage of increasing the switching speed between the optical states.

In a preferred embodiment of the invention, the optical switching device is an electrochemical cell, in which the switching film is switched electrochemically. This is achieved by a device comprising a first and a second electrode separated by an ion conducting electrolyte, the first electrode comprising the switching film of a hydride of a trivalent metal, so that by applying a potential or current between the electrodes a change in reflection of the switching film is observed when the hydride is electrochemically converted from a low-hydrogen reflective state to a high-hydrogen transparent state or black absorbing state by an exchange of hydrogen, and conversely. The switching film is loaded with hydrogen by electrolytic reduction of protons, or oxidation of H$^-$ ions, by applying a potential between the electrodes. At this electrode/electrolyte interface, e.g. protons are reduced to atomic hydrogen. The generated atomic hydrogen (H) will cause a conversion from the reflective state into the transparent state or black absorbent state. Changing the potential leads to oxidation of the latter state into the reflective state. In this way a reversible electro-optical switch is obtained.

In order to promote the speed of hydriding and dehydriding, and thus the switching speed, the metal hydride-containing switching film may be provided with a thin layer of an electrocatalytic metal or alloy, such as palladium, platinum or nickel. These metals catalyst, inter alia, the reduction of protons to hydrogen.

The electrolyte must be a good ion conductor, but an isolator for electrons in order to prevent self-discharge of the device; preferably solid-state electrolytes are used. Examples of good proton (H$^+$) conductors are hydrated oxides, such as $Ta_2O_5.nH_2O$, $Nb_2O_5.nH_2O$, $CeO_2.nH_2O$, $Sb_2O_5.nH_2O$, $Zr(HPO_4)_2.nH_2O$ and $V_2O_5.nH_2O$, $H_3PO_4(WO_3)_{12}.29H_2O$, $H_3PO_4(MoO_3)_{12}.29H_2O$, $[Mg_2Gd(OH)_6]OH.2H_2O$ and anhydrous compounds, such as $KH_2PO_4$, $KH_2AsO_4$, $CeHSO_4$, $CeHSeO_4$, $LiEuH_4$, $Mg(OH)_2$, and compounds of the type $MCeO_3(M=Mg, Ca, Ba, Sr)$, in which a part of Ce has been substituted by Yb, Gd or Nb.

Also glasses may be used, such as alkali-free zirconium phosphate glass. Examples of good ion ($H_3O^+$) conductors are $HUO_2PO_4.4H_2O$ and oxonium β-alumina. Examples of good H$^-$-ion conductors are $CaCl_2/CaH_2$, $Ba_2NH$ and $SrLiH_3$.

Various materials can be used for the counter or second electrode, for example hydrogenated palladium, and transparent (sub-)oxidic materials such as $TiO_2$, $WO_3$, $NiO_z$, $Rh_2O_3$ and $V_2O_5$. These materials can be loaded with hydrogen either by sputtering in a hydrogen atmosphere or electrochemically in a separate step. Also thin layers of hydride-forming intermetallic $AB_2$ and $AB_5$ compounds, such as $TiNi_2$ and $LaNi_5$ can be used.

For the substrates onto which the layers of the switching device may be provided use can be made of metals, such as stainless steel, or transparent materials, such as glass, quartz, or aluminium oxide. These substrates are separate or they form part of the walls of the furnace. If one of the states of the switching film is the transparent state, and the heat-absorbing nature of the walls is used during the cooling state of the wafer, then the whole layer stack, including its substrate, must be transparent.

The switching film, and the other thin layers of the switching device can be applied onto the substrate by means of conventional methods such as vacuum evaporation, sputtering, laser ablation, chemical vapour deposition or electroplating. Inorganic oxidic electrolytes may also be manufactured by a sol-gel process in which for the starting material use is made of a suitable alkoxy compound.

An example of a layer sequence in an electrochemical optical switching device according to the invention is:

substrate|Pd|LiEuH$_4$|GdMgH$_x$|SiO$_2$

In this configuration GdMgH$_x$, is initially in the low-hydrogen reflective state (x<≈2), whereas the palladium counter electrode is loaded with hydrogen. This state is used during the heating stage of the wafer. When a negative potential is applied to the GdMgH$_x$ film, protons are transferred from the palladium through the LiEuH$_4$ electrolyte, and are reduced at the GdMg$_x$ film. By this electrochemical reaction GdMgH$_x$ is converted into GdMgH$_{x+δ}$ (hydrogen-rich state; x+δ≈2.7) which is black and absorbing. This state is used during the cooling stage of the wafer. The switching process is reversible. When a positive potential is applied to the GdMgH$_{x+δ}$ film, this film looses hydrogen and the device becomes reflective again. This switching process can be repeated many times, and takes place at a low voltage within 2 V. A sputtered SiO$_2$ layer serves as a protective layer.

The wafer to be illuminated may require an extremely uniform temperature profile during all stages of a heating cycle, i.e. heating-up stage wherein the wafer edge is hotter than the wafer centre, steady state, and cooling stage wherein the wafer edge is cooler than the wafer centre. If the local temperature differences on a wafer are too large, they may cause stress, resulting in disruption of IC circuits. By applying the switchable reflector according to the invention in different zones, one can achieve multizone temperature control without the need to use multizone lamps as the power source, which currently requires complicated arrays of many lamps of relatively low efficiency. If a furnace with a circular cross-section is used, and the furnace is provided with circular switchable reflectors, e.g. an outer, middle and inner reflector zone, multizone temperature control can be achieved without complicated annular arrays of lamps. In that case, long halogen quartz lamps having a relative high efficiency can still be used.

As stated above, the housing of the furnace may have a circular cross-section, as is currently used for processing 20 mm (8 inch) wafers, or e.g. a rectangular cross-section.

Usual racks or a triple pin array can be used as the means for supporting the wafer.

Heat can be generated by several means, such as quartz halogen lamps or xenon lamps.

The invention also relates to a method for Rapid Thermal Processing of a wafer, especially a semiconductor wafer, which method comprises a heating and a cooling stage. In the heating stage the wafer is subjected to heat radiation, which is reflected to the wafer by a heat-reflecting surface, and in the cooling stage, the heat radiation emitted by the wafer is absorbed by a heat-absorbing surface. Such a method is disclosed in the above-mentioned German patent application DE-A-4142466. The object in accordance with the invention is achieved by a method which, according to the invention, is further characterized in that the heat reflecting and absorbing surfaces are obtained by an optical switching device having a switching film comprising a trivalent metal capable of forming hydrides, which film is reversibly switched by an exchange of hydrogen from a first state, which is a heat-reflecting state, to a second state, which is a heat absorbing state or a transparent state. According to the invention the heat reflectors are not switched mechanically, but (electro)chemically by an exchange of hydrogen.

These and other aspects of the invention will be apparent from and elucidated with reference to the embodiment described hereinafter.

DESCRIPTION OF THE PREFERRED EMBODIMENTS

Figure 1:
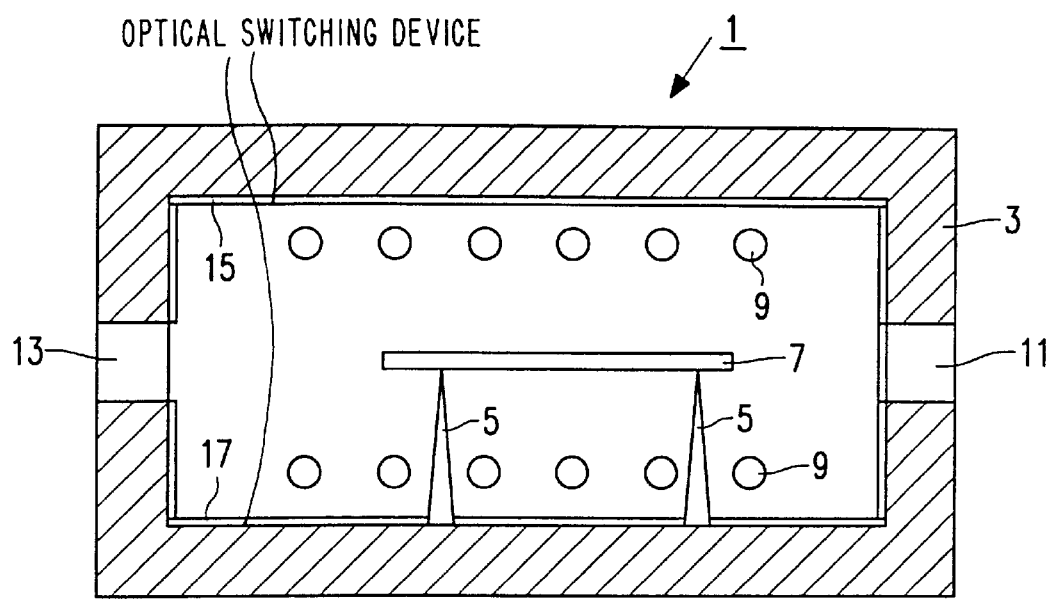
FIG. 1 is a schematic cross-sectional view of a furnace in accordance with the invention.
Figure 2:
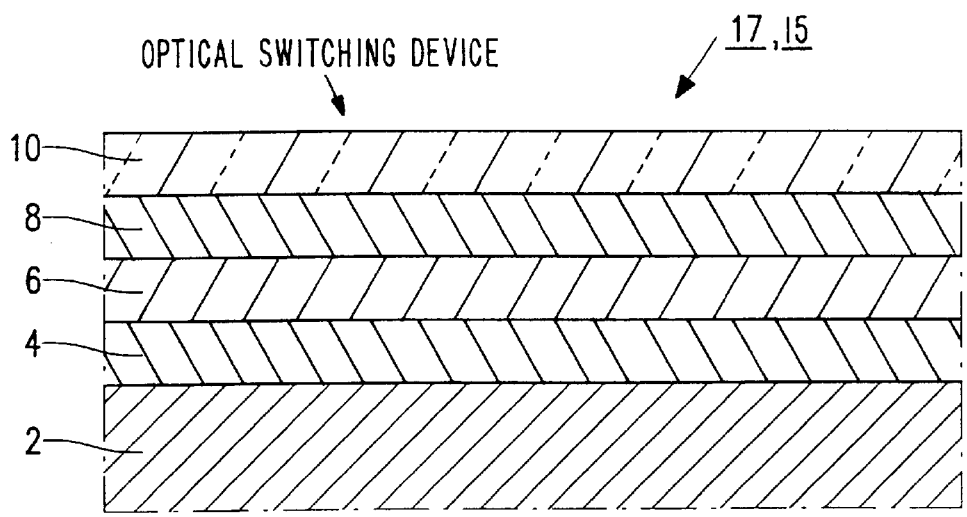
FIG. 2 shows a schematic cross-sectional view of a switching device for use in a furnace according to the invention.

FIG. 1 is a schematic, cross-sectional view of a furnace 1 in accordance with the invention. The furnace comprises a stainless steel housing 3, supports 5 for supporting a wafer 7, and an array of long quartz halogen lamps 9 for generating heat. The housing 3 is provided with openings 11 and 13 for through which the wafer 7 and process gases are introduced. The upper, lower and side walls of the housing 3 are provided with optical switching devices 15 and 17. FIG. 2 is a schematic cross-sectional view of the switching devices 15 and 17. The switching device comprises a stainless steel substrate 2 (which may be part of the wall of the housing 3), a palladium counter electrode 4 which has a thickness of 200 nm and which is loaded with hydrogen by sputtering. On the palladium layer 4, there is provided a 200 nm thick-solid state electrolyte layer 6 of $LiEuH_4$. On layer 6, there is provided a 200 nm thick switching film 8 of a $Gd_{30}Mg_{70}$ (in at %) alloy by means of electron-beam evaporation. On top of the stack, a protective layer 10 of $SiO_2$ having a thickness of 200 nm is applied. Layers 4 and 8 are connected to an external DC current source (not shown). By applying a negative potential to the switching film 8, hydrogen is transported from the palladium layer 4 to the switching film 8. At the location of the switching film 8, protons are reduced to hydrogen, whereafter high-hydrogen hydride $Gd_{0.3}Mg_{0.7}H_x$ ($x \approx 2.7$) is formed, which material is black and heat absorbing. This state is used during the cooling stage of the wafer. When the current running through the layer stack is reversed, hydrogen is transported from the switching film 8 to the palladium electrode 4. In the switching film 8, a hydride $Gd_{0.3}Mg_{0.7}H_x$ ($x \approx 2$) having a lower hydrogen content is formed, which is mirror-like and reflects heat. This state is used during the heating stage of the wafer.

By applying a voltage within ±1V between the switching film 8 and the counter electrode 4, the switching device can be quickly switched between a heat-reflecting state and a heat absorbing state. In this way, mechanically driven rotatable mirrors are avoided in the furnace.

What is claimed is:

1. A method for Rapid Thermal Processing of a wafer, comprising a heating and a cooling stage, in which method, in the heating stage the wafer is subjected to heat radiation which is reflected to the wafer by a heat-reflecting surface, and in the cooling stage, the heat radiation emitted by the wafer is absorbed by a heat-absorbing surface, characterized in that the heat-reflecting and heat-absorbing surfaces are formed by an optical switching device having a switching film comprising a trivalent metal capable of forming hydrides, which film is reversibly switched, by an exchange of hydrogen, from a first state, which is a heat-reflecting state, to a second state, which is a heat-absorbing state or a transparent state.

* * * * *